(12) United States Patent
Yi et al.

(10) Patent No.: US 8,110,485 B2
(45) Date of Patent: Feb. 7, 2012

(54) NANOCRYSTAL SILICON LAYER STRUCTURES FORMED USING PLASMA DEPOSITION TECHNIQUE, METHODS OF FORMING THE SAME, NONVOLATILE MEMORY DEVICES HAVING THE NANOCRYSTAL SILICON LAYER STRUCTURES, AND METHODS OF FABRICATING THE NONVOLATILE MEMORY DEVICES

(75) Inventors: Jun sin Yi, Seocho-gu (KR); Byoung deog Choi, Yongin-si (KR); Sung wook Jung, Suwon-si (KR); Kyung soo Jang, Seoul (KR); Jae hyun Cho, Gyeongsan-si (KR)

(73) Assignee: Sungkyunkwan University Foundation for Corporate Collaboration (KR)

( * ) Notice: Subject to any disclaimer, the term of this patent is extended or adjusted under 35 U.S.C. 154(b) by 318 days.

(21) Appl. No.: 12/388,846

(22) Filed: Feb. 19, 2009

(65) Prior Publication Data

US 2010/0148181 A1 Jun. 17, 2010

(30) Foreign Application Priority Data

Dec. 17, 2008 (KR) .......................... 10-2008-0128316

(51) Int. Cl.
*H01L 21/36* (2006.01)
*H01L 29/76* (2006.01)

(52) U.S. Cl. .......................................... 438/487; 257/67
(58) Field of Classification Search .................. 438/680, 438/485–490; 257/67, 352
See application file for complete search history.

(56) References Cited

U.S. PATENT DOCUMENTS

| 4,940,505 A | * | 7/1990 | Schachameyer et al. | ....... 117/97 |
| 5,264,070 A | * | 11/1993 | Urquhart et al. | ................ 117/97 |
| 5,830,538 A | * | 11/1998 | Gates et al. | .................. 427/535 |

* cited by examiner

*Primary Examiner* — Calvin Lee
(74) *Attorney, Agent, or Firm* — Camoriano and Associates; Theresa Fritz Camoriano

(57) ABSTRACT

Provided are nanocrystal silicon layer structures formed using a plasma deposition technique, methods of forming the same, nonvolatile memory devices including the nanocrystal silicon layer structures, and methods of fabricating the nonvolatile memory devices. A method of forming a nanocrystal silicon layer structure includes forming a buffer layer on a substrate and forming a nanocrystal silicon layer on the buffer layer by a plasma deposition technique using silicon (Si)-containing gas and hydrogen ($H_2$)-containing gas. In this method, the nanocrystal silicon layer can be directly deposited on a glass substrate using plasma vapor deposition without performing a post-processing process so that the fabrication of a nonvolatile memory device can be simplified, thereby reducing fabrication cost.

10 Claims, 7 Drawing Sheets

NANOCRYSTAL SILICON LAYER STRUCTURES FORMED USING PLASMA DEPOSITION TECHNIQUE, METHODS OF FORMING THE SAME, NONVOLATILE MEMORY DEVICES HAVING THE NANOCRYSTAL SILICON LAYER STRUCTURES, AND METHODS OF FABRICATING THE NONVOLATILE MEMORY DEVICES

CROSS-REFERENCE TO RELATED APPLICATION

This application claims priority to and the benefit of Korean Patent Application No. 10-2008-0128316, filed on Dec. 17, 2008, the disclosure of which is incorporated herein by reference in its entirety.

BACKGROUND

1. Field of the Invention

The present invention relates to nanocrystal silicon layer structures formed using a plasma deposition technique, methods of forming the same, nonvolatile memory devices including the nanocrystal silicon layer structures, and methods of fabricating the nonvolatile memory devices, and more particularly, to nonvolatile memory devices including nanocrystal silicon layer structures formed on a glass substrate and methods of fabricating nonvolatile memory devices which can be formed at a low temperature and driven at a low voltage.

2. Discussion of Related Art

In general, nonvolatile memory devices may be categorized as either a NAND type or a NOR type depending on the construction and operation of a cell. Alternatively, nonvolatile memory devices may be classified into a floating-gate memory device, a metal-oxide-nitride-oxide-semiconductor (MONOS) memory device, or a silicon-oxide-nitride-oxide-semiconductor (SONOS) memory device depending on the type of a charge storage layer material used for a unit cell. The floating-gate memory device performs memory functions using a potential well, and the MONOS and SONOS memory devices perform memory functions using a trap site present in a bulk of a silicon-nitride dielectric layer or in an interface between dielectric layers. The MONOS memory device includes a control gate formed of a metal, while the SONOS memory device includes a control gate formed of polysilicon (poly-Si).

When compared with the floating-gate nonvolatile memory device, the SONOS and MONOS memory devices may be easily scaled down and have higher endurance and more uniform threshold-voltage distribution.

Hereinafter, conventional nonvolatile memory devices will be described with reference to FIGS. 1A and 1B. FIGS. 1A and 1B are cross-sectional views of conventional nonvolatile memory devices formed on a semiconductor substrate and a glass substrate, respectively.

Referring to FIG. 1A, an example of a conventional nonvolatile memory device includes a first oxide layer 2, a nitride layer 3, and a second oxide layer 4 that are sequentially stacked on a semiconductor substrate 1. A gate electrode 5 is formed on the second oxide layer 4, and a source region 6 and a drain region 7 are respectively formed in the semiconductor substrate 1 at both sides of the gate electrode 5.

The first oxide layer 2 functions to allow electrons to tunnel into a trap region of the nitride layer 3 or a trap region between the first oxide layer 2 and the nitride layer 3. The second oxide layer 4 blocks the transport of charges between the nitride layer 3 and the gate electrode 5. The nitride layer 3 stores charges in the trap region thereof or the trap region between the first oxide layer 2 and the nitride layer 3.

Referring to FIG. 1B, another example of a conventional nonvolatile memory device includes a buffer oxide layer 9 formed on a glass substrate 8 to protect the glass substrate 8. An amorphous silicon (a-Si) layer is formed on the buffer oxide layer 9 using a plasma-enhanced chemical vapor deposition (PECVD) technique. The a-Si layer is irradiated with laser beams and crystallized into a poly-Si layer 10.

Thereafter, a first oxide layer 11, a nitride layer 12, a second oxide layer 13, and a gate electrode 14 are sequentially formed on the poly-Si layer 10. The surface of the poly-Si layer 10 is heavily doped with impurity ions at both sides of the gate electrode 14, thereby forming a source region 15 and a drain region 16. However, since the poly-Si layer 10 has a very rough, nonuniform surface, when the nonvolatile memory device is fabricated on the glass substrate 8, a leakage current characteristic may deteriorate. As a result, the nonvolatile memory device cannot properly perform program/erase operations.

In order to solve this problem, Korean Patent Registration No. 0719680 dated May 11, 2007 by Byeong-deok Choi et al discloses a nonvolatile memory device including a buffer oxide layer, a poly-Si layer, a silicon oxynitride layer, a first insulating layer, a nitride layer, a second insulating layer, and a metal electrode that are sequentially stacked on a glass substrate. The silicon oxynitride layer is obtained by modifying a rough top surface of the poly-Si layer using nitrous oxide ($N_2O$) plasma. Accordingly, the disclosed nonvolatile memory device may prevent an excessive leakage current from occurring due to the rough, nonuniform surface of the poly-Si layer, which results from irradiation of an a-Si layer with laser beams.

However, in the nonvolatile memory device disclosed in Korean Patent Registration No. 0719680, the formation of the poly-Si layer involves forming an a-Si layer on the buffer layer and crystallizing the a-Si layer using an excimer laser annealing (ELA) process or a solid-phase crystallization (SPC) process. As a result, the fabrication of the nonvolatile memory device becomes more complicated and expensive.

SUMMARY OF THE INVENTION

The present invention is directed to a nanocrystal silicon layer structure formed using a plasma deposition technique, a method of forming the nanocrystal silicon layer structure, a nonvolatile memory device including the nanocrystal silicon layer structure, and a method of fabricating the nonvolatile memory device, in which a nanocrystal silicon layer can be directly deposited on a glass substrate by a plasma-enhanced vapor deposition process instead of a conventional method by which an amorphous silicon (a-Si) layer is deposited on a substrate and crystallized into a polycrystalline silicon (poly-Si) layer using a post-processing process.

Also, the present invention is directed to a nanocrystal silicon layer structure formed using a plasma deposition technique, a method of forming the nanocrystal silicon layer structure, a nonvolatile memory device including the nanocrystal silicon layer structure, and a method of fabricating the nonvolatile memory device, in which a nanocrystal silicon layer can be directly deposited on a glass substrate to improve a leakage current characteristic, compared with the conventional art.

In addition, the present invention is directed to a nanocrystal silicon layer structure formed using a plasma deposition technique, a method of forming the nanocrystal silicon layer structure, a nonvolatile memory device including the nanocrystal silicon layer structure, and a method of fabricating the nonvolatile memory device, in which a nanocrystal silicon layer and a multilayered insulating layer can be sequentially deposited without interrupting vacuum in a plasma deposition apparatus.

Furthermore, the present invention is directed to a nanocrystal silicon layer structure formed using a plasma deposition technique, a method of forming the nanocrystal silicon layer structure, a nonvolatile memory device including the nanocrystal silicon layer structure, and a method of fabricating the nonvolatile memory device, in which a post-processing process can be omitted to simplify the fabrication of the nonvolatile memory device and reduce fabrication cost.

Moreover, the present invention is directed to a nanocrystal silicon layer structure formed using a plasma deposition technique, a method of forming the nanocrystal silicon layer structure, a nonvolatile memory device including the nanocrystal silicon layer structure, and a method of fabricating the nonvolatile memory device, in which a nanocrystal silicon layer and a multilayered insulating layer can be formed in a plasma deposition apparatus maintained at a lower temperature than in the conventional art to reduce damage to the nonvolatile memory device.

According to an aspect of the present invention, a method of forming a nanocrystal silicon layer structure includes: forming a buffer layer on a substrate; and forming a nanocrystal silicon layer on the buffer layer by a plasma deposition technique using Si-containing gas and hydrogen ($H_2$)-containing gas.

The nanocrystal silicon layer may be formed by supplying silane ($SiH_4$) gas at a flow rate of about 1 to 10 sccm and hydrogen gas at a flow rate of about 90 to 99 sccm.

The nanocrystal silicon layer may be formed to a thickness of about 40 to 60 nm.

The nanocrystal silicon layer may be formed by a plasma-enhanced chemical vapor deposition (PECVD) process or an inductively coupled plasma CVD (ICP-CVD) process.

The nanocrystal silicon layer may be formed at a temperature of about 250 to 350° C.

The method may further include forming a silicon oxynitride ($SiO_xN_y$) layer by processing the surface of the nanocrystal silicon layer in a plasma atmosphere under conditions where nitrous oxide ($N_2O$) gas is supplied at a flow rate of about 1.5 to 5 sccm and a radio-frequency (RF) power of about 50 to 550 W is applied.

The silicon oxynitride layer may be formed at the same temperature as the nanocrystal silicon layer.

The silicon oxynitride layer may be formed to a thickness of about 2.0 to 3.0 nm.

According to another aspect of the present invention, a method of fabricating a nonvolatile memory device including a nanocrystal silicon layer structure includes: forming a buffer layer on a substrate; forming a nanocrystal silicon layer on the buffer layer by a plasma deposition technique using Si-containing gas and $H_2$-containing gas; forming a gate pattern on the nanocrystal silicon layer; and defining a portion of the nanocrystal silicon layer disposed under the gate pattern as a channel region, and forming a source region and a drain region by performing an ion implantation process on the remaining portion of the nanocrystal silicon layer disposed outside the channel region using the gate pattern as a mask.

The nanocrystal silicon layer may be formed by supplying silane gas at a flow rate of about 1 to 10 sccm and hydrogen gas at a flow rate of about 90 to 99 sccm.

The nanocrystal silicon layer may be formed to a thickness of about 40 to 60 nm.

The nanocrystal silicon layer may be formed by a PECVD process or an ICP-CVD process.

The nanocrystal silicon layer may be formed at a temperature of about 250 to 350° C.

The formation of the gate pattern may include: forming a tunneling insulating layer on the nanocrystal silicon layer; forming a charge storage layer on the tunneling insulating layer; forming a blocking insulating layer on the charge storage layer; forming a gate electrode layer on the blocking insulating layer; and sequentially patterning the gate electrode layer, the blocking insulating layer, the charge storage layer, and the tunneling insulating layer.

The tunneling insulating layer may be formed of a silicon oxynitride layer.

The silicon oxynitride layer may be formed by processing the surface of the nanocrystal silicon layer in a plasma atmosphere under conditions where nitrous oxide gas is supplied at a flow rate of about 1.5 to 5 sccm and an RF power of about 50 to 550 W is applied.

The silicon oxynitride layer may be formed at the same temperature as the nanocrystal silicon layer.

The silicon oxynitride layer may be formed to a thickness of about 2.0 to 3.0 nm.

According to still another aspect of the present invention, a method of fabricating a nonvolatile memory device including a nanocrystal silicon layer structure includes: forming a gate electrode on a substrate; forming a multilayered insulating layer on the substrate having the gate electrode; forming a first nanocrystal silicon layer on the multilayered insulating layer by a plasma deposition technique using Si-containing gas and $H_2$-containing gas; forming a metal electrode layer on the first nanocrystal silicon layer; and forming a source electrode and a drain electrode by patterning the metal electrode layer.

The first nanocrystal silicon layer may be formed to a thickness of about 40 to 60 nm.

The formation of the multilayered insulating layer may include: forming a blocking insulating layer on the substrate having the gate electrode; forming a charge storage layer on the blocking insulating layer; and forming a tunneling insulating layer on the charge storage layer.

The formation of the tunneling insulating layer may include: forming a second nanocrystal silicon layer on the charge storage layer; and processing the second nanocrystal silicon layer in a plasma atmosphere.

The tunneling insulating layer may be formed of a silicon oxynitride layer.

The silicon oxynitride layer may be formed by performing a plasma processing process under conditions where nitrous oxide gas is supplied at a flow rate of about 1.5 to 5 sccm and an RF power of about 50 to 550 W is applied.

The silicon oxynitride layer may be formed at the same temperature as the nanocrystal silicon layer.

The silicon oxynitride layer may be formed to a thickness of about 2.0 to 3.0 nm.

According to yet another aspect of the present invention, a nonvolatile memory device including a nanocrystal silicon layer structure includes: a buffer layer disposed on a substrate; a nanocrystal silicon layer formed on the buffer layer by a plasma deposition technique using Si-containing gas and $H_2$-containing gas; a gate pattern disposed on the nanocrystal silicon layer; and a source region and a drain region defining a portion of the nanocrystal silicon layer disposed under the gate pattern as a channel region and doped with impurity ions in the nanocrystal silicon layer disposed outside the channel region.

The nanocrystal silicon layer may have a thickness of about 40 to 60 nm.

The gate pattern may include: a tunneling insulating layer pattern disposed on the nanocrystal silicon layer; a charge storage layer pattern disposed on the tunneling insulating layer pattern; a blocking insulating layer pattern disposed on the charge storage layer pattern; and a gate electrode layer pattern disposed on the blocking insulating layer pattern.

The tunneling insulating layer may be a silicon oxynitride layer.

The silicon oxynitride layer may have a thickness of about 2.0 to 3.0 nm.

Each of the charge storage layer pattern and the blocking insulating layer pattern may be a silicon nitride layer pattern or a silicon oxide layer pattern.

The silicon nitride layer pattern may have a thickness of about 15 to 25 nm, and the silicon oxide layer pattern may have a thickness of about 5 to 15 nm.

According to yet another aspect of the present invention, a nonvolatile memory device including a nanocrystal silicon layer structure includes: a buffer layer disposed on a substrate; a gate electrode disposed on the buffer layer; a multilayered insulating layer disposed on the substrate to cover the gate electrode; a first nanocrystal silicon layer formed on the multilayered insulating layer by a plasma deposition technique using Si-containing gas and $H_2$-containing gas; and a source electrode and a drain electrode disposed apart from each other on the first nanocrystal silicon layer to expose a portion of the first nanocrystal silicon layer disposed over the gate electrode.

The multilayered insulating layer may include: a blocking insulating layer disposed on the substrate having the gate electrode; a charge storage layer disposed on the blocking insulating layer; and a tunneling insulating layer disposed on the charge storage layer.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Hereinafter, a method of fabricating a nonvolatile memory device according to an exemplary embodiment of the present invention will be described in detail with reference to FIGS. 2A through 2E. FIGS. 2A through 2E are cross-sectional views illustrating a method of fabricating a nonvolatile memory device according to an exemplary embodiment of the present invention.

Figure 1A:
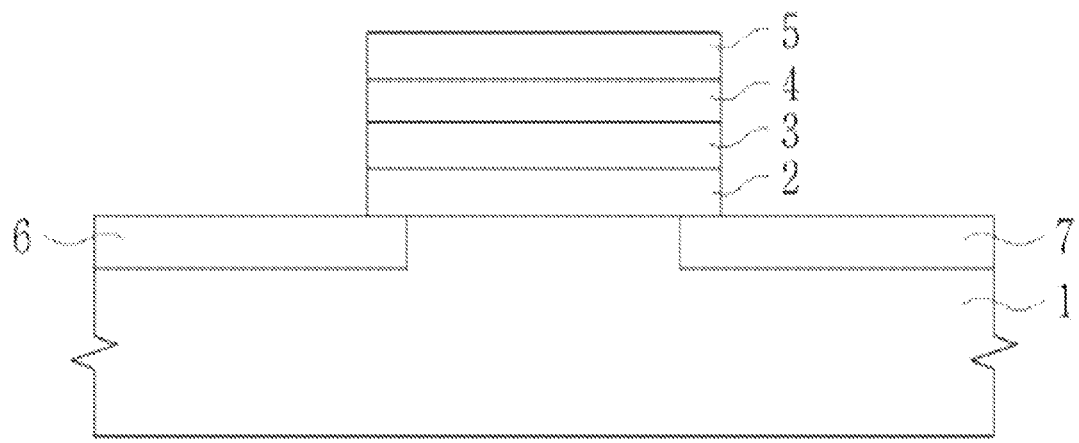
FIG. 1A is a cross-sectional view of a conventional nonvolatile memory device formed on a semiconductor substrate.
Figure 1B:
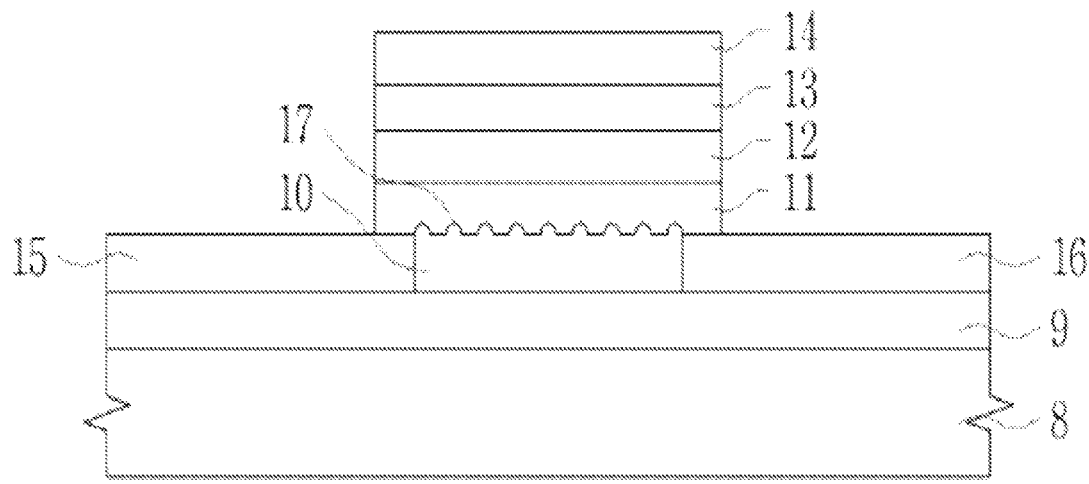
FIG. 1B is a cross-sectional view of a conventional nonvolatile memory device formed on a glass substrate.
Figure 2A:
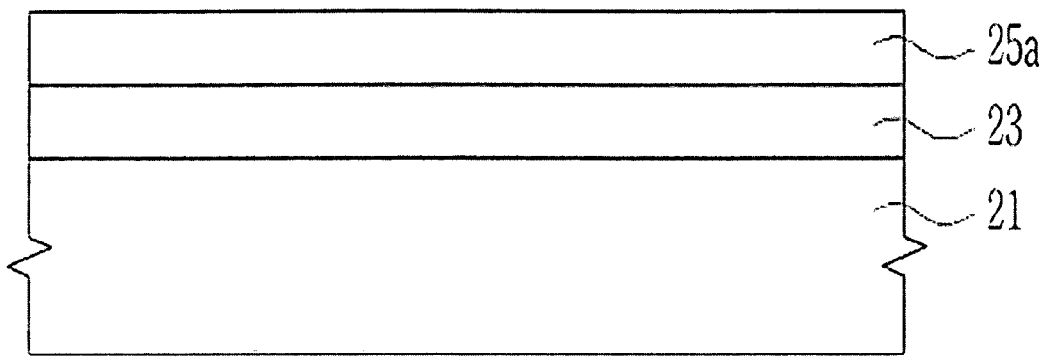
FIGS. 2A through 2E are cross-sectional views illustrating a method of fabricating a nonvolatile memory device according to an exemplary embodiment of the present invention.

Referring to FIG. 2A, a method of forming a nonvolatile Memory device according to an exemplary embodiment of the present invention may include sequentially forming a buffer layer 23 and a nanocrystal silicon layer 25a on a substrate 21. The substrate 21 may be a glass substrate. The buffer layer 23 may be one selected from the group consisting of a silicon nitride layer, a silicon oxide layer, and a stacked layer thereof. The buffer layer 23 may include a silicon nitride layer and a silicon oxide layer, which are sequentially stacked, in consideration of thermal expansion and interfacial states between the buffer layer 23 and other thin layers. In this case, the silicon nitride layer may be formed to a thickness of about 170 to 230 nm, and the silicon oxide layer may be formed to a thickness of about 70 to 130 nm.

The nanocrystal silicon layer 25a may be formed using a plasma deposition process, for example, a plasma-enhanced chemical vapor deposition (PECVD) process or an inductively coupled plasma CVD (ICP-CVD) process. In this case, the nanocrystal silicon layer 25a may be formed using silane ($SiH_4$) gas and hydrogen ($H_2$) gas. As the content of hydrogen increases, the crystallization characteristics of the nanocrystal silicon layer 25a become better, while a rate of deposition of the nanocrystal silicon layer 25a on the buffer layer 23 decreases. Accordingly, the nanocrystal silicon layer 25a may be formed by supplying silane gas at a flow rate of about 1 to 10 sccm and hydrogen gas at a flow rate of about 90 to 99 sccm. Also, the nanocrystal silicon layer 25a may be formed at a temperature of about 250 to 350° C.

The nonvolatile memory device according to the present example embodiment may serve as a drive device of a flat panel display (FPD). In this case, as the thickness of the nanocrystal silicon layer 25a increases, a driving current density increases. However, a leakage current also increases. Accordingly, the nanocrystal silicon layer 25a may be formed to a thickness of about 40 to 60 nm in consideration of driving and leakage current characteristics. According to an exemplary embodiment of the present invention, the nanocrystal silicon layer 25a may have a thickness of about 50 nm.

Figure 2B:
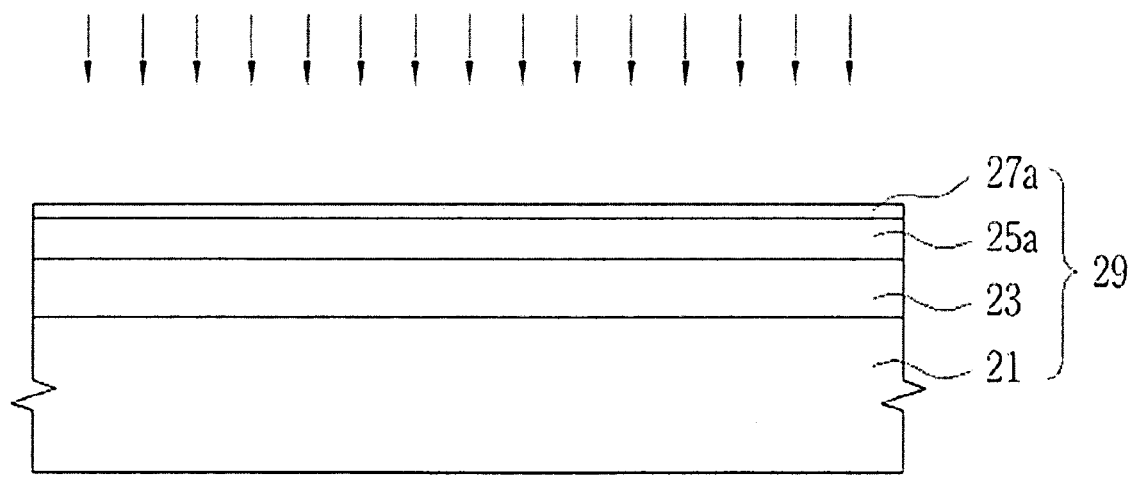

Referring to FIG. 2B, a tunneling insulating layer 27a may be formed on the nanocrystal silicon layer 25a. The tunneling insulating layer 27a may be a silicon oxynitride ($SiO_xN_y$) layer. The silicon oxynitride layer may be formed by reforming the surface of the nanocrystal silicon layer 25a by supplying nitrous oxide ($N_2O$) gas to the substrate 21 having the nanocrystal silicon layer 25a. The silicon oxynitride layer may be obtained in the same plasma apparatus as the nanocrystal silicon layer 25a. The silicon oxynitride layer may be formed by supplying the nitrous oxide gas at a flow rate of about 1.5 to 5 sccm and applying a radio-frequency (RF) power of about 50 to 550 W at a temperature of about 250 to 350° C.

In this case, the silicon oxynitride layer may be formed by supplying nitrous oxide gas at a flow rate of about 2.5 sccm and applying an RF power of about 150 W in consideration of its optical and electrical properties. In addition, the silicon oxynitride layer may be formed at the same temperature as the nanocrystal silicon layer 25a. As the thickness of the tunneling insulating layer 27a decreases, an operating voltage decreases, but a data retention characteristic deteriorates. Accordingly, the tunneling insulating layer 27a may be formed to a thickness of about 2.0 to 3.0 nm in order to reduce the operating voltage and improve the data retention characteristic.

As a result, the substrate 21, the buffer layer 23, the nanocrystal silicon layer 25a, and the tunneling insulating layer 27a may constitute a nanocrystal silicon layer structure 29.

Figure 2C:
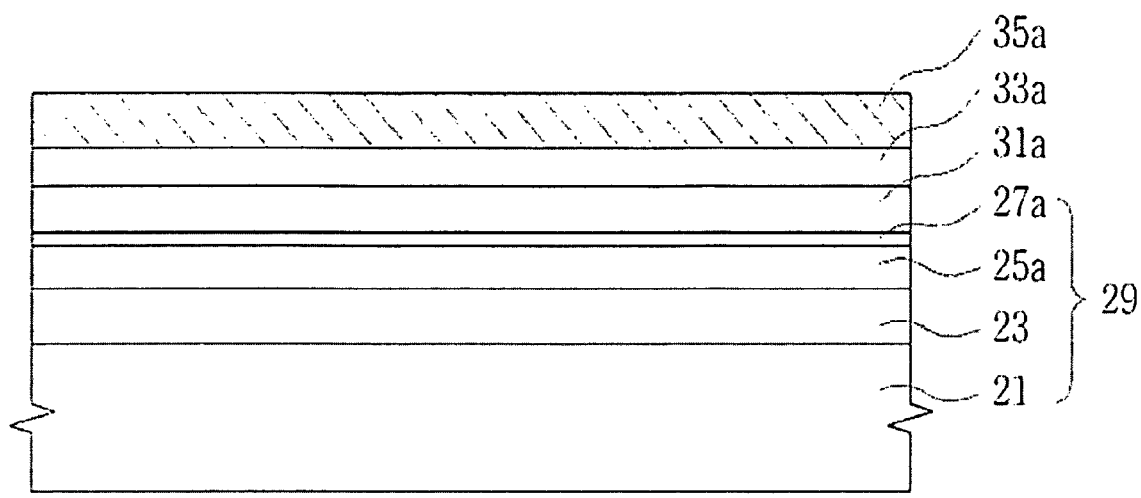

Referring to FIG. 2C, a charge storage layer 31a and a blocking insulating layer 33a may be sequentially formed on the tunneling insulating layer 27a. Each of the charge storage layer 31a and the blocking insulating layer 33a may be formed of a silicon nitride layer or a silicon oxide layer. For example, when the charge storage layer 31a is formed of a silicon nitride layer, the blocking insulating layer 33a may be formed of a silicon oxide layer. Also, when the charge storage layer 31a is formed of a silicon oxide layer, the blocking insulating layer 33a may be formed of a silicon nitride layer. In this case, the silicon nitride layer may be formed by supplying silane gas and ammonia ($NH_3$) gas in a flow-rate ratio of 6:4 at a temperature of about 300° C. and with an RF power of about 200 W. The silicon oxide layer may be formed by supplying silane gas and nitrous oxide gas in a flow-rate ratio of 6:4 at a temperature of about 300° C. and with an RF power of about 250 W. The silicon nitride layer may be formed to a thickness of about 15 to 25 nm, and the silicon oxide layer may be formed to a thickness of about 5 to 15 nm.

The charge storage layer 31a may be formed of a different material from the blocking insulating layer 33a. A gate electrode layer 35a may be formed on the blocking insulating layer 33a. The gate electrode layer 35a may be formed of a material selected from the group consisting of aluminum (Al), chrome (Cr), silver (Ag), and gold (Au). Also, the gate electrode layer 35a may be formed by crystallizing an amorphous silicon (a-Si) layer with laser irradiation.

Figure 2D:
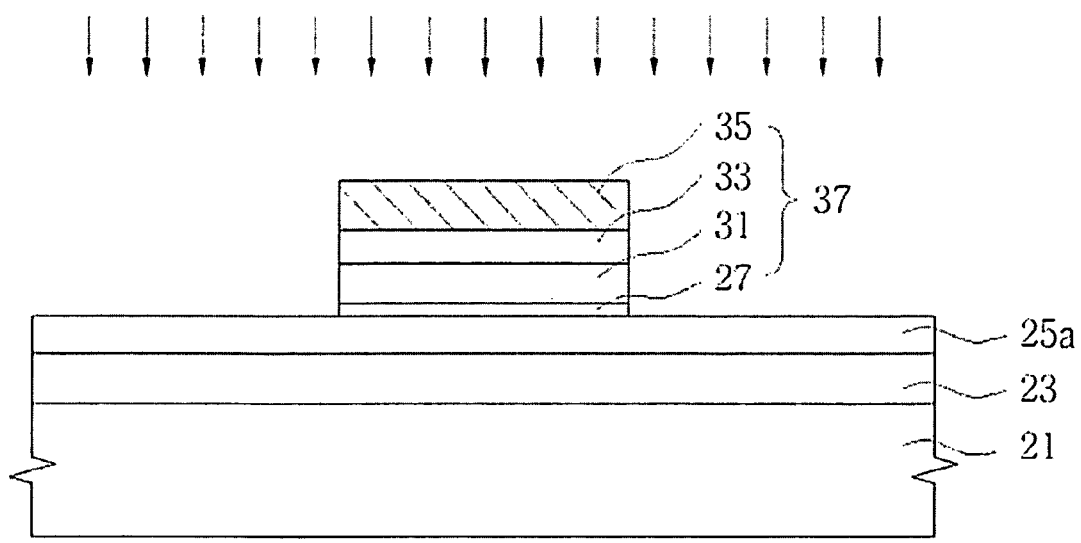
Figure 2E:
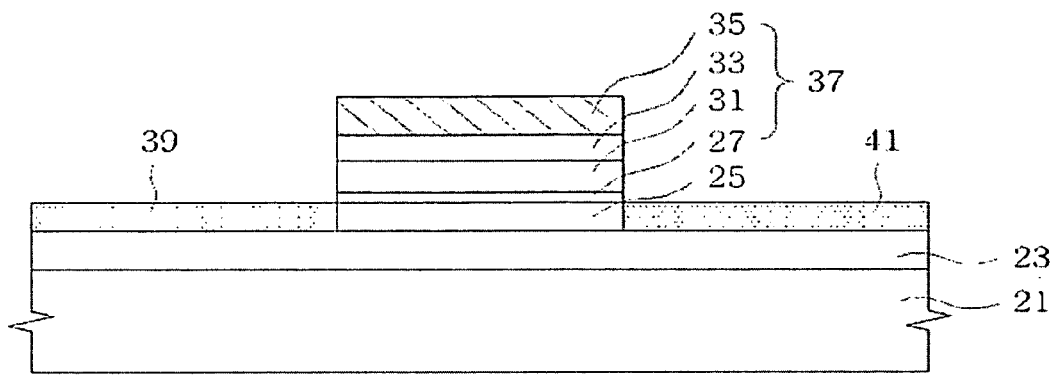

Referring to FIGS. 2D and 2E, the gate electrode 35a, the blocking insulating layer 33a, the charge storage layer 31a, and the tunneling insulating layer 27a may be sequentially patterned, thereby partially exposing an upper portion of the nanocrystal silicon layer 25a. The patterning process is known to those skilled in the art and thus, a detailed description thereof will be omitted.

Thus, the gate electrode layer 35a, the blocking insulating layer 33a, the charge storage layer 31a, and the tunneling insulating layer 27a may be patterned to form a gate electrode layer pattern 35, a blocking insulating layer pattern 33, a charge storage layer pattern 31, and a tunneling insulating layer pattern 27, respectively. As a result, the gate electrode layer pattern 35, the blocking insulating layer pattern 33, the charge storage layer pattern 31, and the tunneling insulating layer pattern 27 may constitute a gate pattern 37.

A portion of the nanocrystal silicon layer 25a disposed under the gate pattern 37 may be defined as a channel region 25, and an ion implantation process may be performed on the exposed portion of the nanocrystal silicon layer 25a using the gate pattern 37 as a mask, thereby forming a source region 39 and a drain region 41. As a consequence, a top-gate-type nonvolatile memory device 50 according to an exemplary embodiment of the present invention may be formed.

Hereinafter, a method of fabricating a nonvolatile memory device according to another exemplary embodiment of the present invention will be described with reference to FIGS. 3A through 3F. FIGS. 3A through 3F are cross-sectional views illustrating a method of fabricating a nonvolatile memory device according to another exemplary embodiment of the present invention.

Figure 3A:
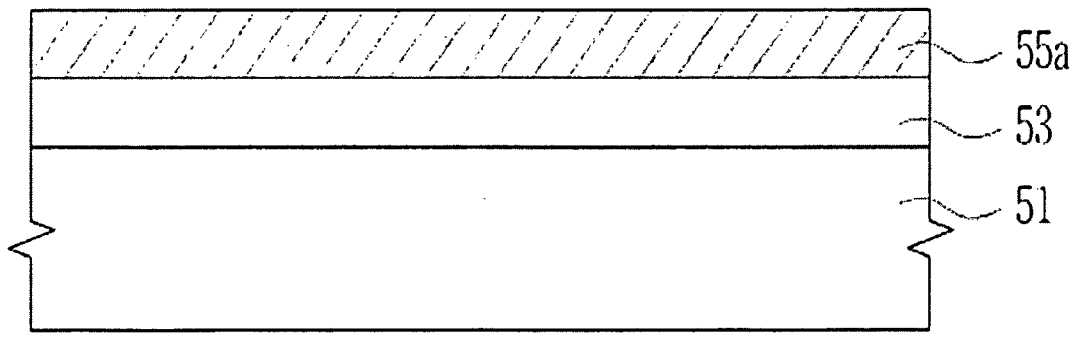
FIGS. 3A through 3F are cross-sectional views illustrating a method of fabricating a nonvolatile memory device according to another exemplary embodiment of the present invention.
Figure 3B:
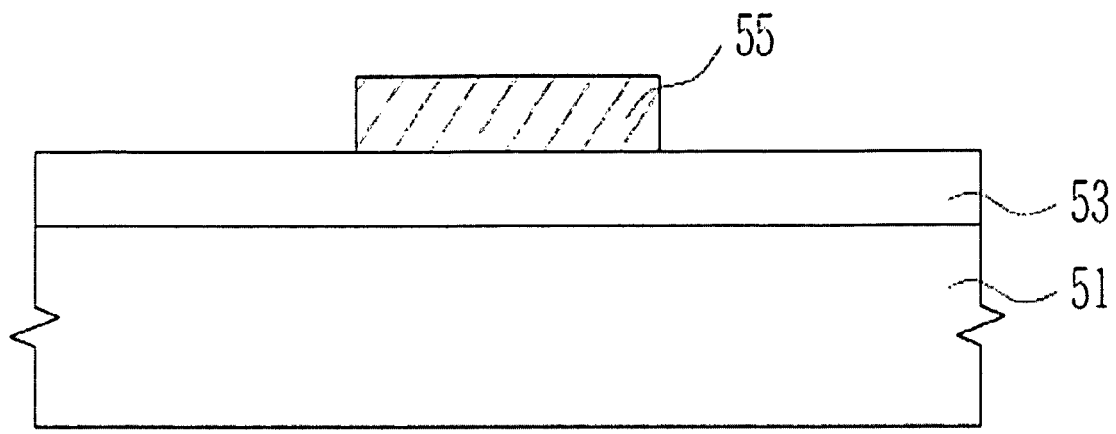

Referring to FIGS. 3A and 3B, a method of fabricating a nonvolatile memory device according to another exemplary embodiment of the present invention may include forming a buffer layer 53 on a substrate 51. The substrate 51 may be a glass substrate. The buffer layer 53 may be one selected from the group consisting of a silicon nitride layer, a silicon oxide layer, and a stacked layer thereof. The buffer layer 53 may include a silicon nitride layer and a silicon oxide layer, which are sequentially stacked, in consideration of thermal expansion and interfacial states between the buffer layer 53 and other thin layers. In this case, the silicon nitride layer may be formed to a thickness of about 170 to 230 nm, and the silicon oxide layer may be formed to a thickness of about 70 to 130 nm.

A gate electrode layer 55a may be formed on the buffer layer 53 and patterned, thereby forming a gate electrode 55. The gate electrode 55 may be formed of a material selected from the group consisting of aluminum, chrome, silver, and gold. Also, the gate electrode layer 55a may be formed by crystallizing an a-Si layer with laser irradiation.

Figure 3C:
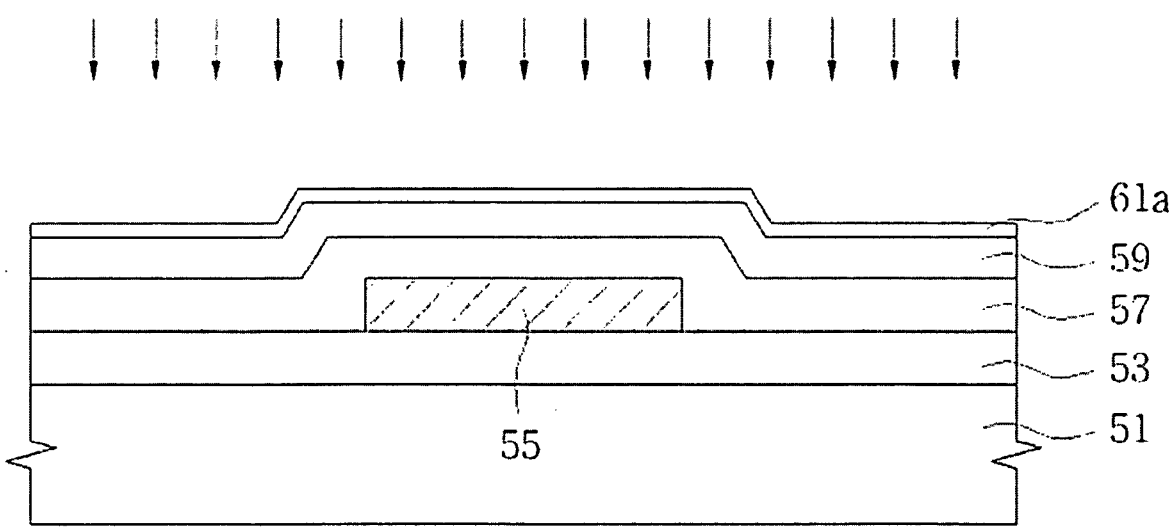
Figure 3D:
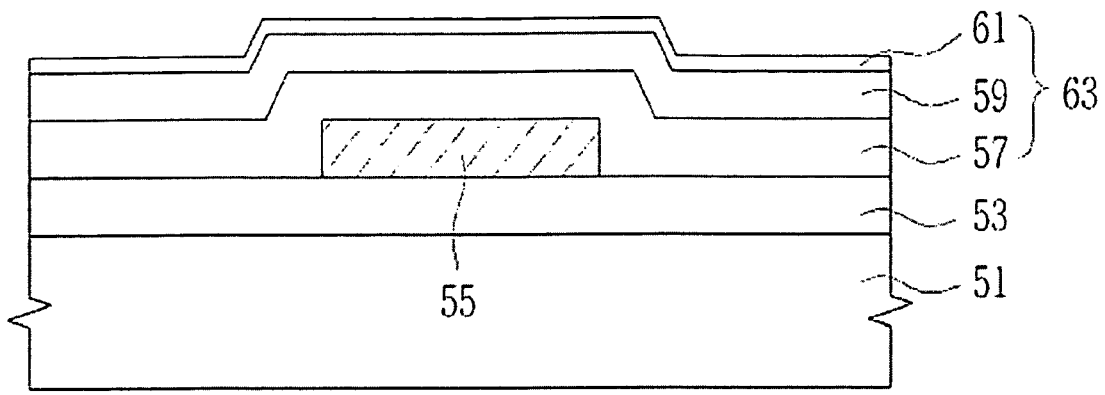

Referring to FIGS. 3C and 3D, a blocking insulating layer 57 and a charge storage layer 59 may be sequentially stacked on the substrate 51 having the gate electrode 55. Each of the blocking insulating layer 57 and the charge storage layer 59 may be formed of a silicon nitride layer or a silicon oxide layer. For example, when the blocking insulating layer 57 is formed of a silicon nitride layer, the charge storage layer 59 may be formed of a silicon oxide layer. Also, when the blocking insulating layer is formed of a silicon oxide layer, the charge storage layer 59 may be formed of a silicon nitride layer.

In this case, the silicon nitride layer may be formed by supplying silane gas and ammonia gas in a flow-rate ratio of 6:4 at a temperature of about 300° C. and with an RF power of about 200 W. The silicon oxide layer may be formed by supplying silane gas and nitrous oxide gas in a flow-rate ratio of 6:4 at a temperature of about 300□ and with an RF power of about 250 W. The silicon nitride layer may be formed to a thickness of about 15 to 25 nm, and the silicon oxide layer may be formed to a thickness of about 5 to 15 nm. The charge storage layer 59 may be formed of a different material from the blocking insulating layer 57.

A hyperfine nanocrystal silicon layer 61a may be formed on the charge storage layer 59. The hyperfine nanocrystal silicon layer 61a may be formed using a plasma deposition process, for example, PECVD process or an ICP-CVD process. In this case, the hyperfine nanocrystal silicon layer 61a may be formed using silane gas and hydrogen gas. The hyperfine nanocrystal silicon layer 61a may supplying silane gas at a flow rate of about 1 to 10 sccm and hydrogen gas at a flow rate of about 90 to 99 sccm. In addition, the hyperfine nanocrystal silicon layer 61a may be formed at a temperature of about 250 to 350° C. The hyperfine nanocrystal silicon layer 61a may be formed to a thickness of about 2.0 to 3.0 nm.

The hyperfine nanocrystal silicon layer 61a may be processed in a plasma atmosphere and reformed to form a tunneling insulating layer 61. The plasma processing process may be performed by supplying nitrous oxide gas at a flow rate of about 1.5 to 5.0 sccm with an RF power of about 50 to 550 W and at a temperature of about 250 to 350° C. In this case, the plasma processing process may be performed by supplying nitrous oxide gas at a flow rate of about 2.5 sccm with an RF power of about 150 W and at a temperature of about 300° C. As a result, the tunneling insulating layer 61 may be a silicon oxynitride layer formed to the same thickness as the hyperfine nanocrystal silicon layer 61a.

Hereinafter, a structure obtained by sequentially stacking the blocking insulating layer 57, the charge storage layer 59, and the tunneling insulating layer 61 on the substrate 51 having the gate electrode 55 will be referred to as a multilayered insulating layer 63.

Figure 3E:
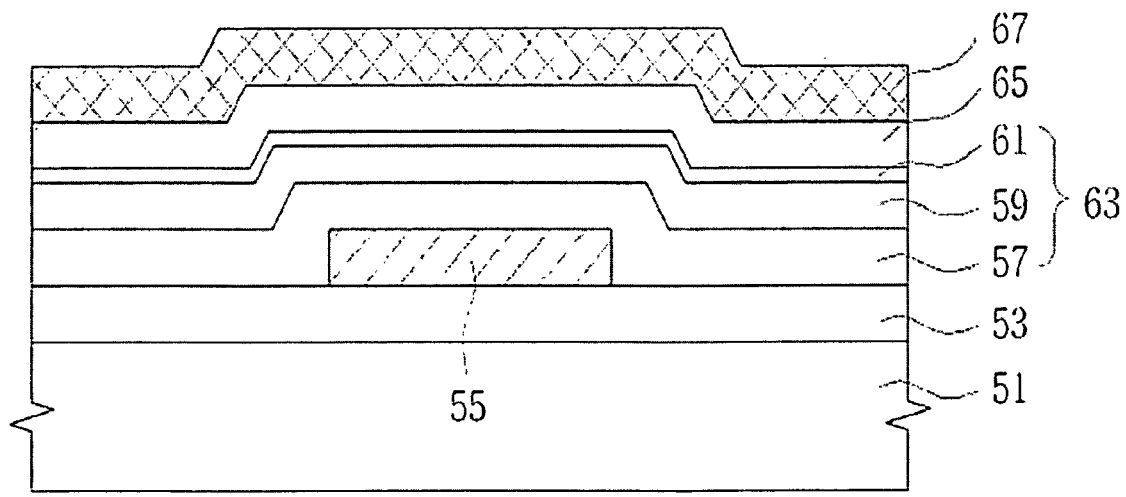
Figure 3F:
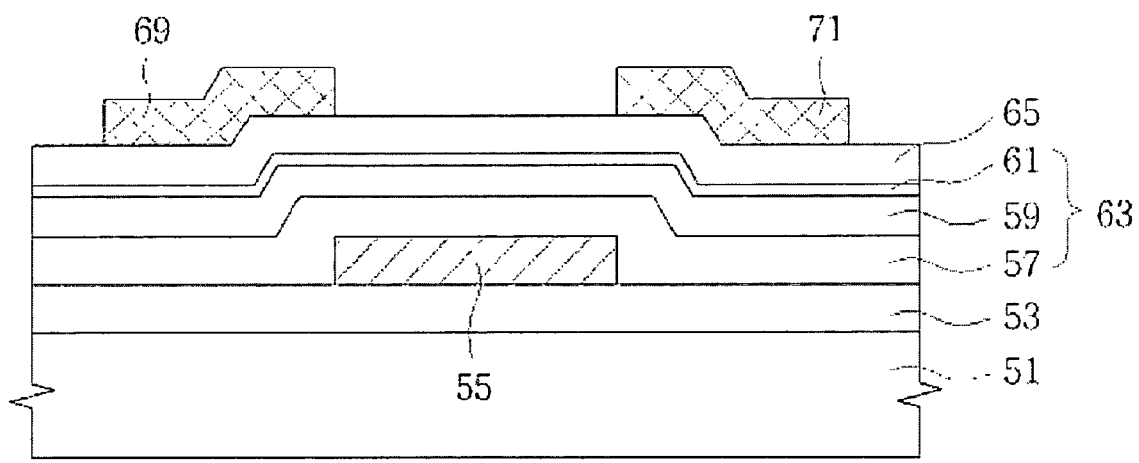

Referring to FIGS. 3E and 3F, a first nanocrystal silicon layer 65 may be formed on the multilayered insulating layer 63. The first nanocrystal silicon layer 65 may be formed using the same deposition apparatus as the hyperfine nanocrystal silicon layer 61a (hereinafter, referred to as "second nanocrystal silicon layer").

The first nanocrystal silicon layer 65 may be formed at the same temperature as the second nanocrystal silicon layer 61a. The first nanocrystal silicon layer 65 may be formed to a thickness of about 40 to 60 nm. When the nanocrystal memory device according to the present exemplary embodiment serves as a drive device of an FPD, as the thickness of the first nanocrystal silicon layer 65 increases, a driving current density increases. However, a leakage current also increases. Accordingly, the nanocrystal silicon layer 65 may be formed to a thickness of about 50 nm in consideration of driving and leakage current characteristics.

A metal electrode layer 67 may be formed on the first nanocrystal silicon layer 65. The metal electrode layer 67 may be formed of aluminum, chrome, silver, or gold. Also, the gate electrode layer 55a may be formed by crystallizing an a-Si layer with laser irradiation. The metal electrode layer 67 may be patterned using a known method, thereby forming a source electrode 69 and a drain electrode 71. As a consequence, a bottom-gate-type nonvolatile memory device 100 according to another exemplary embodiment of the present invention may be formed.

Hereinafter, the structure of a nonvolatile memory device according to an exemplary embodiment of the present invention will be described with reference to FIG. 2E.

Referring to FIG. 2E, a top-gate-type nonvolatile memory device 50 according to an exemplary embodiment of the present invention may include a buffer layer 23 disposed on a substrate 21. The substrate 21 may be a glass substrate. The buffer layer 23 may be one selected from the group consisting of a silicon nitride layer, a silicon oxide layer, and a stacked layer thereof. In consideration of thermal expansion and interfacial states between the buffer layer 23 and other thin layers, the buffer layer 23 may be a double layer obtained by sequentially stacking a silicon nitride layer and a silicon oxide layer on the substrate 21. In this case, the silicon nitride layer may have a thickness of about 170 to 230 nm, and the silicon oxide layer may have a thickness of about 70 to 130 nm. By means of a plasma deposition technique using Si-containing gas and $H_2$-containing gas, a nanocrystal silicon layer 25a may be disposed on the buffer layer 23. The nanocrystal silicon layer 25a may have a thickness of about 40 to 60 nm.

When the nonvolatile memory device 50 according to the present exemplary embodiment serves as a drive device of an FPD, as the thickness of the nanocrystal silicon layer 25a increases, a driving current density increases. However, a leakage current also increases. Accordingly, the nanocrystal silicon layer 25a may have a thickness of about 50 nm in consideration of driving and leakage current characteristics.

A gate pattern 37 having a tunneling insulating layer pattern 27, a charge storage layer pattern 31, a blocking insulating layer pattern 33, and a gate electrode layer pattern 35 that are sequentially stacked may be disposed on the nanocrystal silicon layer 25a. The tunneling insulating layer pattern 27 may be formed of a silicon oxynitride layer. As the thickness of the tunneling insulating layer 27a decreases, an operating voltage decreases, but a data retention characteristic deteriorates. Accordingly, the tunneling insulating layer pattern 27 may be formed to a thickness of about 2.0 to 3.0 nm in order to reduce the operating voltage and improve the data retention characteristic.

The charge storage layer pattern 31 and the blocking insulating layer pattern 33 are sequentially stacked on the tunneling insulating layer pattern 27. Each of the charge storage layer pattern 31 and the blocking insulating layer pattern 33 may be formed of a silicon oxide layer or a silicon nitride layer. For example, when the charge storage layer pattern 31 is formed of a silicon nitride layer, the blocking insulating layer pattern 33 may be formed of a silicon oxide layer. Also, when the charge storage layer pattern 31 is formed of a silicon oxide layer, the blocking insulating layer pattern 33 may be formed of a silicon nitride layer. The silicon nitride layer may be formed to a thickness of about 15 to 25 nm, and the silicon oxide layer may be formed to a thickness of about 5 to 15 nm. The charge storage layer pattern 31 may be formed of a different material layer from the blocking insulating layer pattern 33. The gate electrode layer pattern 35 may be formed of one selected from the group consisting of aluminum, chrome, silver, and gold. Alternatively, the gate electrode layer pattern 35 may be formed of a polycrystalline silicon (poly-Si) layer.

A portion of the nanocrystal silicon layer 25a disposed under the gate pattern 37 may be defined as a channel region 25, and a source region 39 and a drain region 41, which are doped with impurity ions, may be disposed in the remaining portion of the nanocrystal silicon layer 25a disposed outside the channel region 25.

Hereinafter, the structure of a nonvolatile memory device according to another exemplary embodiment of the present invention will be described with reference to FIG. 3F.

Referring to FIG. 3F, a nonvolatile memory device 100 according to another exemplary embodiment of the present invention may include a buffer layer 53 disposed on a substrate 51. The substrate 51 may be a glass substrate. The buffer layer 53 may be one selected from the group consisting of a silicon nitride layer, a silicon oxide layer, and a stacked layer thereof. The buffer layer 53 may be a double layer obtained by sequentially stacking a silicon nitride layer and a silicon oxide layer on the substrate 51 in consideration of thermal expansion and interfacial states between the buffer layer 53 and other thin layers. In this case, the silicon nitride layer may be formed to a thickness of about 170 to 230 nm, and the silicon oxide layer may be formed to a thickness of about 70 to 130 nm.

A gate electrode 55 may be disposed on the buffer layer 53. The gate electrode 55 may be formed of a material selected from the group consisting of aluminum, chrome, silver, and gold. Also, the gate electrode layer 55a may be formed of a poly-Si layer formed by irradiating an a-Si layer with laser beams.

A blocking insulating layer 57 and a charge storage layer 59 may be sequentially stacked on the substrate 51 having the gate electrode 55. Each of the blocking insulating layer 57 and the charge storage layer 59 may be a silicon nitride layer or a silicon oxide layer. For example, when the blocking insulating layer 57 is a silicon nitride layer, the charge storage layer 59 may be a silicon oxide layer. Also, when the blocking insulating layer 57 is a silicon oxide layer, the charge storage layer 59 may be a silicon nitride layer. The silicon nitride layer may be formed to a thickness of about 15 to 25 nm, and the silicon oxide layer may be formed to a thickness of about 5 to 15 nm. The charge storage layer 59 may be a different material layer from the blocking insulating layer 57.

A first nanocrystal silicon layer 65 may be disposed on the charge storage layer 59. The first nanocrystal silicon layer 65 may have a thickness of about 40 to 60 nm. When the nonvolatile memory device 100 according to the present exemplary embodiment serves as a drive device of an FPD, as the thickness of the first nanocrystal silicon layer 65 increases, a driving current density increases. However, a leakage current also increases. Accordingly, the first nanocrystal silicon layer 65 may have a thickness of about 50 nm in consideration of driving and leakage current characteristics.

A tunneling insulating layer 61 may be interposed between the charge storage layer 59 and the first nanocrystal silicon layer 65. The tunneling insulating layer 61 may be a silicon oxynitride layer. The silicon oxynitride layer may have a thickness of about 2.0 to 3.0 nm. The silicon oxynitride layer may be obtained by reforming a hyperfine nanocrystal silicon layer 61a interposed between the charge storage layer 59 and the first nanocrystal silicon layer 65. The tunneling insulating layer 61 may have the same thickness as the hyperfine nanocrystal silicon layer 61a.

A source electrode 69 and a drain electrode 71 may be disposed apart from each other on the first nanocrystal silicon layer 65. Each of the source and drain electrodes 69 and 71 may be formed of a material selected from the group consisting of aluminum, chrome, silver, and gold. Also, the gate electrode layer 55a may be a poly-Si layer obtained by crystallizing an a-Si layer with laser irradiation.

According to the present invention as described above, a nanocrystal silicon layer can be directly deposited on a glass substrate using a plasma vapor deposition technique without performing a post-processing process so that the fabrication of a nonvolatile memory device can be simplified, thereby reducing fabrication cost.

Also, according to the present invention, a nanocrystal silicon layer and a multilayered insulating layer can be sequentially deposited without interrupting vacuum in a plasma deposition apparatus.

Furthermore, according to the present invention, a nanocrystal silicon layer structure and a multilayered insulating layer can be formed in a plasma deposition apparatus maintained at a lower temperature than in the conventional art, thereby reducing damage to a nonvolatile memory device.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents. For example, the present invention may be applied to the fabrication of a nanodevice using a nanostructure having a self-assembly characteristic.

In the drawings, the thicknesses of layers and regions are exaggerated for clarity. It will also be understood that when an element or layer is referred to as being "on" another element or layer, it can be directly on the other element or layer or intervening layers or elements may also be present.

The present invention relates to nanocrystal silicon layer structures formed using a plasma deposition technique, methods of forming the same, nonvolatile memory devices including the nanocrystal silicon layer structures, and methods of fabricating the nonvolatile memory devices. The nanocrystal silicon layer structures and methods of forming the same according to the present invention may be widely applied to the fabrication of nonvolatile memory devices. In addition, the nonvolatile memory devices including nanocrystal silicon layers and methods of fabricating the same may be applied in the fields of displays including FPDs and to the fabrication of semiconductor devices using the displays.

What is claimed is:

1. A method of fabricating a nonvolatile memory device, comprising:
    forming a buffer layer on a substrate;
    forming a nanocrystal silicon layer on the buffer layer by a plasma deposition technique using Si-containing gas and $H_2$-containing gas;
    forming a gate pattern on the nanocrystal silicon layer; and
    defining a portion of the nanocrystal silicon layer disposed under the gate pattern as a channel region, and forming a source region and a drain region by performing an ion implantation process on the remaining portion of the nanocrystal silicon layer disposed outside the channel region using the gate pattern as a mask.

2. The method of claim 1, wherein the nanocrystal silicon layer is formed by supplying silane gas at a flow rate of about 1 to 10 sccm and hydrogen gas at a flow rate of about 90 to 99 sccm.

3. The method of claim 2, wherein the nanocrystal silicon layer is formed to a thickness of about 40 to 60 nm.

4. The method of claim 1, wherein the nanocrystal silicon layer is formed by a PECVD process or an ICP-CVD process.

5. The method of claim 1, wherein the nanocrystal silicon layer is formed at a temperature of about 250 to 350° C.

6. The method of claim 1, wherein the forming the gate pattern comprises:
    forming a tunneling insulating layer on the nanocrystal silicon layer;
    forming a charge storage layer on the tunneling insulating layer;
    forming a blocking insulating layer on the charge storage layer;
    forming a gate electrode layer on the blocking insulating layer; and
    sequentially patterning the gate electrode layer, the blocking insulating layer, the charge storage layer, and the tunneling insulating layer.

7. The method of claim 6, wherein the tunneling insulating layer is formed of a silicon oxynitride layer.

8. The method of claim 7, wherein the silicon oxynitride layer is formed by processing the surface of the nanocrystal silicon layer in a plasma atmosphere under conditions where nitrous oxide gas is supplied at a flow rate of about 1.5 to 5 sccm and an RF power of about 50 to 550 W is applied.

9. The method of claim 8, wherein the silicon oxynitride layer is formed at the same temperature as the nanocrystal silicon layer.

10. The method of claim 7, wherein the silicon oxynitride layer is formed to a thickness of about 2.0 to 3.0 nm.

* * * * *